(12) United States Patent
Gangi

(10) Patent No.: US 11,038,049 B2
(45) Date of Patent: Jun. 15, 2021

(54) SEMICONDUCTOR DEVICE

(71) Applicant: KABUSHIKI KAISHA TOSHIBA, Minato-ku (JP)

(72) Inventor: Hiro Gangi, Ota (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/790,822

(22) Filed: Feb. 14, 2020

(65) Prior Publication Data
US 2021/0083097 A1 Mar. 18, 2021

(30) Foreign Application Priority Data

Sep. 13, 2019 (JP) .............................. JP2019-167644

(51) Int. Cl.
| | | |
|---|---|---|
| *H01L 29/78* | (2006.01) | |
| *H01L 29/423* | (2006.01) | |
| *H01L 29/16* | (2006.01) | |
| *H01L 29/06* | (2006.01) | |
| *H01L 29/40* | (2006.01) | |

(52) U.S. Cl.
CPC ...... *H01L 29/7813* (2013.01); *H01L 29/0696* (2013.01); *H01L 29/16* (2013.01); *H01L 29/407* (2013.01); *H01L 29/4236* (2013.01); *H01L 29/401* (2013.01); *H01L 29/7811* (2013.01)

(58) Field of Classification Search
CPC . H01L 29/7893; H01L 29/4236; H01L 29/16; H01L 29/0696; H01L 29/407; H01L 29/404; H01L 29/408

USPC ........ 257/330, 331, 332; 438/259, 270, 271, 438/589
See application file for complete search history.

(56) References Cited

U.S. PATENT DOCUMENTS

| | | |
|---|---|---|
| 8,629,505 B2 | 1/2014 | Nishiwaki |
| 9,224,823 B2 | 12/2015 | Katoh et al. |
| 2007/0194375 A1* | 8/2007 | Kawaguchi et al. ....... H01L 29/0634 257/330 |

(Continued)

FOREIGN PATENT DOCUMENTS

| | | |
|---|---|---|
| JP | 2012-059943 A | 3/2012 |
| JP | 2014-187141 A | 10/2014 |
| WO | WO 2018/078776 A1 | 5/2018 |

*Primary Examiner* — Thinh T Nguyen
(74) *Attorney, Agent, or Firm* — Oblon, McClelland, Maier & Neustadt, L.L.P.

(57) ABSTRACT

A semiconductor device according to an embodiment includes: a semiconductor layer including a first trench having a mesh-shaped pattern, a second trench surrounded by the first trench, a first semiconductor region of a first conductivity type, a second semiconductor region of a second conductivity type, and a third semiconductor region of the first conductivity type; a gate electrode located in the first trench; a first field plate electrode located in the first trench; a second field plate electrode located in the second trench; a gate insulating layer located between the gate electrode and the semiconductor layer; a first insulating layer located between the first field plate electrode and the semiconductor layer; a second insulating layer located between the second field plate electrode and the semiconductor layer; a first electrode electrically connected to the first field plate electrode and the second field plate electrode; and a second electrode.

15 Claims, 14 Drawing Sheets

(56) References Cited

U.S. PATENT DOCUMENTS

2016/0064477 A1  3/2016  Blank et al.
2019/0252543 A1  8/2019  Fukunaga et al.

* cited by examiner

SEMICONDUCTOR DEVICE

CROSS-REFERENCE TO RELATED APPLICATION

This application is based upon and claims the benefit of priority from Japanese Patent Application No. 2019-167644, filed on Sep. 13, 2019, the entire contents of which are incorporated herein by reference.

FIELD

Embodiments described herein relate generally to semiconductor devices.

BACKGROUND

In order to reduce the size of the transistor or to improve the performance of the transistor, a vertical type transistor where a gate electrode is buried in a trench is used. In the vertical type transistor, the drain-source breakdown voltage (hereinafter, simply denoted as a "breakdown voltage") and the on-resistance has a trade-off relationship. That is, if the impurity concentration of the drift region is increased in order to reduce the on-resistance, the breakdown voltage is decreased. On the contrary, if the impurity concentration of the drift region is decreased in order to improve the breakdown voltage, the on-resistance is increased.

As a method of improving the trade-off of the breakdown voltage and the on-resistance, there is a structure in which a field plate electrode is provided in a trench of a vertical type transistor. By changing the electric field distribution in the drift region by using the field plate electrode, for example, while the breakdown voltage is maintained, the impurity concentration of the drift region can be increased. Therefore, while the breakdown voltage is maintained, it is possible to reduce the on-resistance.

DETAILED DESCRIPTION

Figure 1:
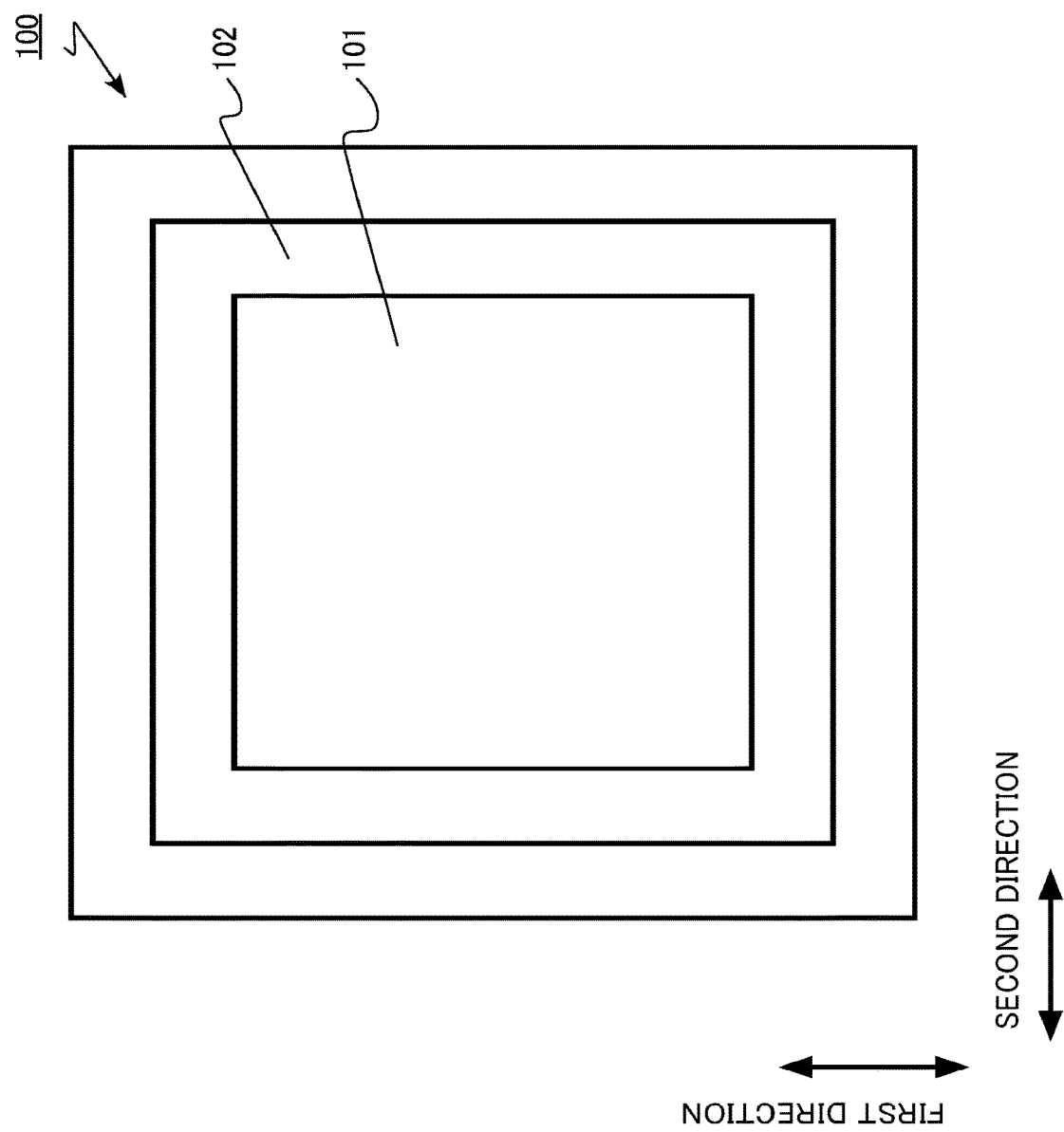
FIG. 1 is a schematic plan view of a semiconductor device according to a first embodiment.

A semiconductor device according to an embodiment includes: a semiconductor layer having a first plane and a second plane facing the first plane, the semiconductor layer including a first trench located on a side closer to the first plane and having a mesh-shaped pattern on the first plane, a second trench located on the side closer to the first plane and surrounded by the first trench, a first semiconductor region of a first conductivity type, a second semiconductor region of a second conductivity type located between the first semiconductor region and the first plane, and a third semiconductor region of the first conductivity type located between the second semiconductor region and the first plane; a gate electrode located in the first trench; a first field plate electrode located between the gate electrode and the second plane in the first trench; a second field plate electrode located in the second trench; a gate insulating layer located between the gate electrode and the semiconductor layer; a first insulating layer located between the first field plate electrode and the semiconductor layer; a second insulating layer located between the second field plate electrode and the semiconductor layer; a first electrode located on the side closer to the first plane and electrically connected to the third semiconductor region, the first field plate electrode, and the second field plate electrode; and a second electrode located on a side of the semiconductor layer closer to the second plane.

Hereinafter, embodiments will be described with reference to the drawings. In addition, in the following description, the same or similar members are denoted by the same reference numerals, and the description of the members or the like that have been described once is omitted as appropriate.

In addition, in the following description, the notations $n^+$, n, $n^-$ and $p^+$, p, $p^-$ represent the relative levels of the impurity concentrations in the respective conductivity types. That is, $n^+$ represents to be relatively higher in the n-type impurity concentration than n, and $n^-$ represents to be relatively lower in the n-type impurity concentration than n. In addition, $p^+$ represents to be relatively higher in the p-type impurity concentration than p, and $p^-$ represents to be relatively lower in the p-type impurity concentration than p. In addition, in some cases, the $n^+$-type and the $n^-$-type may be simply referred to as the n-type and the $p^+$-type and $p^-$-type may be simply referred to as the p-type.

The impurity concentration can be measured by, for example, secondary ion mass spectrometry (SIMS). In addition, the relative level of the impurity concentration can be determined from the level of the carrier concentration obtained by, for example, scanning capacitance microscopy (SCM). In addition, the distance such as the width and depth of the impurity region can be obtained by, for example, SIMS. In addition, the distance such as the width and depth of the impurity region can be obtained from, for example, an SCM image.

The depth of the trench, the thickness of the insulating layer, and the like can be measured on images of, for example, an SIMS and a transmission electron microscope (TEM).

First Embodiment

A semiconductor device according to a first embodiment includes a semiconductor layer having a first plane and a second plane facing the first plane, the semiconductor layer including a first trench located on a side closer to the first plane and having a mesh-shaped pattern on the first plane, a second trench located on the side closer to the first plane and surrounded by the first trench, a first semiconductor region of a first conductivity type, a second semiconductor region of a second conductivity type located between the first semiconductor region and the first plane, and a third semiconductor region of the first conductivity type located between the second semiconductor region and the first plane; a gate electrode located in the first trench; a first field plate electrode located between the gate electrode and the second plane in the first trench; a second field plate electrode located in the second trench; a gate insulating layer located between the gate electrode and the semiconductor layer; a first insulating layer located between the first field plate electrode and the semiconductor layer; a second insulating layer located between the second field plate electrode and the semiconductor layer; a first electrode located on the side closer to the first plane and electrically connected to the third semiconductor region, the first field plate electrode, and the second field plate electrode; and a second electrode located on a side of the semiconductor layer closer to the second plane.

The semiconductor device according to the first embodiment is a vertical type transistor where a gate electrode is buried in a trench. The semiconductor device according to the first embodiment is a vertical type power metal oxide semiconductor field effect transistor (the MOSFET). The semiconductor device according to the first embodiment is a MOSFET 100.

Hereinafter, a case where the first conductivity type is n-type and the second conductivity type is p-type, that is, the case of an n-channel the MOSFET in which electrons are used as carriers is described as an example.

FIG. 1 is a schematic plan view of the semiconductor device according to the first embodiment. The MOSFET 100 according to the first embodiment has an active region 101 and a termination region 102. The active region 101 is surrounded by the termination region 102.

The active region 101 functions as a region through which current flows during the time of on-operation of the MOSFET 100. The termination region 102 functions as a region for relaxing a strength of an electric field applied to an end portion of active region 101 during the time of off-operation of the MOSFET 100 and improving a breakdown voltage of the MOSFET 100.

Figure 2:
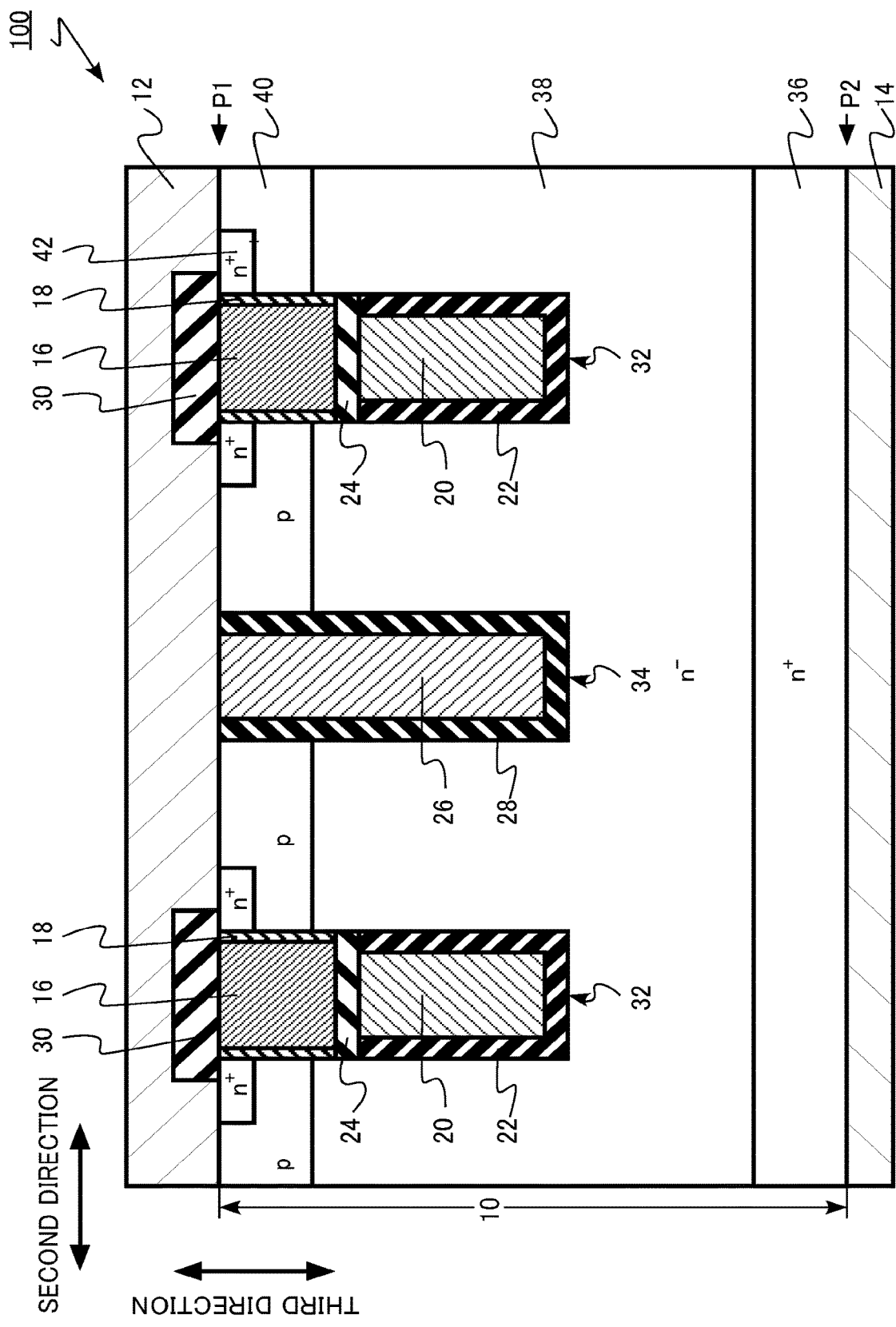
FIG. 2 is a schematic cross-sectional view of the semiconductor device according to the first embodiment.

FIG. 2 is a schematic cross-section view of the semiconductor device according to the first embodiment. FIG. 2 is a cross-sectional view of a portion of the active region 101 of the MOSFET 100. FIG. 2 is a cross-sectional view taken along line AA' of FIG. 3.

Figure 3:
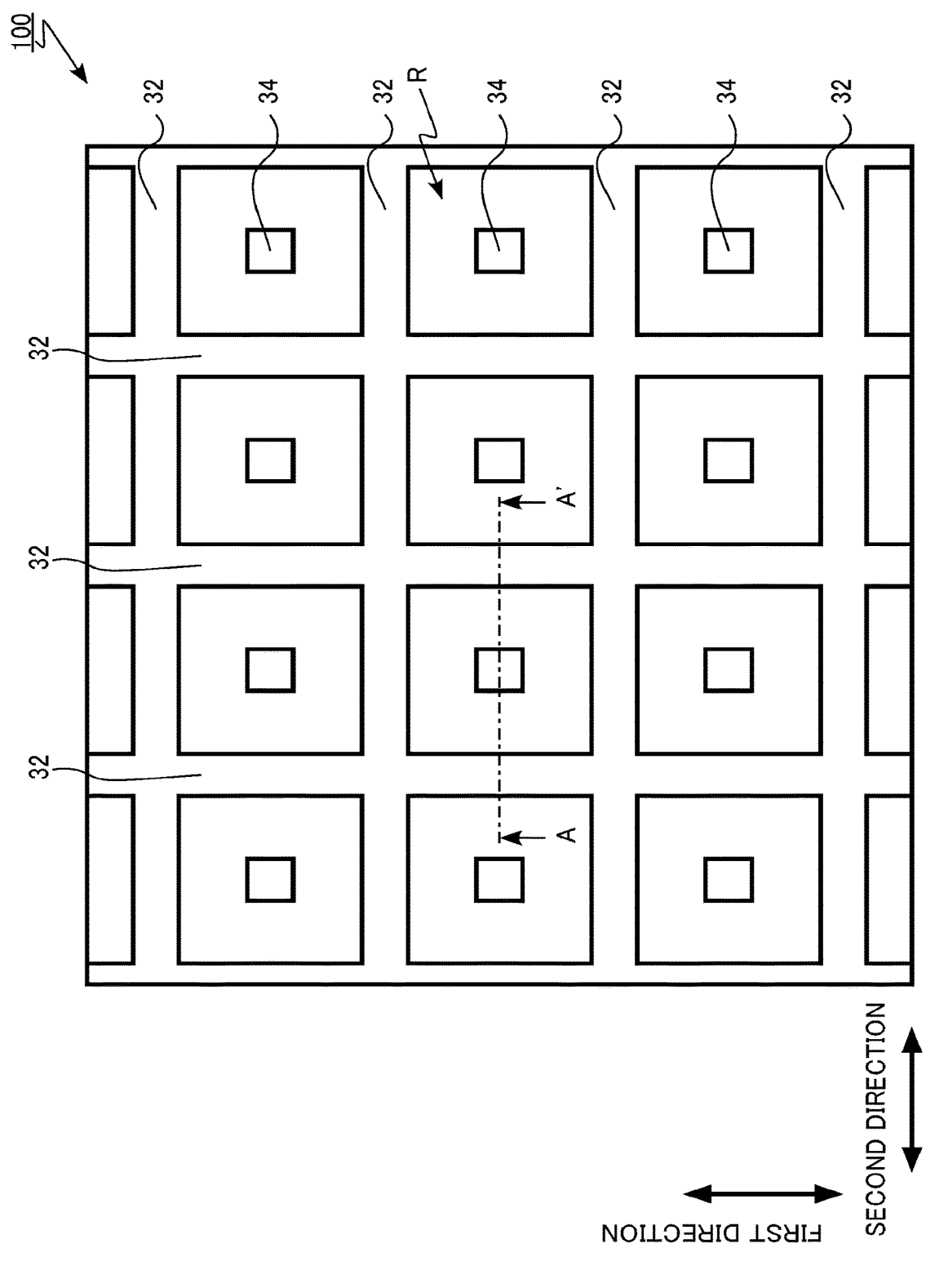
FIG. 3 is a schematic plan view of the semiconductor device according to the first embodiment.

FIG. 3 is a schematic plan view of the semiconductor device according to the first embodiment. FIG. 3 is a plan view of a portion of the active region 101 of the MOSFET 100. FIG. 3 is a plan view on a first plane (P1 in FIG. 2) in FIG. 2.

The MOSFET 100 includes a silicon layer 10 (semiconductor layer), a source electrode 12 (first electrode), a drain electrode 14 (second electrode), a gate electrode 16, a gate insulating layer 18, a first field plate electrode 20, a first field plate insulating layer 22 (first insulating layer), an intermediate insulating layer 24, a second field plate electrode 26, a second field plate insulating layer 28 (second insulating layer), an interlayer insulating layer 30.

The silicon layer 10 has a first trench 32, a second trench 34, an n$^+$-type drain region 36, an n$^-$-type drift region 38 (first semiconductor region), a p-type body region 40 (second semiconductor region), and an n$^+$-type source region 42 (third semiconductor region).

The silicon layer 10 is located between the source electrode 12 and the drain electrode 14. The silicon layer 10 includes a first plane ("P1" in FIG. 2) and a second plane ("P2" in FIG. 2). Hereinafter, the first plane P1 is also referred to as a front surface, and the second plane P2 is also referred to as a back surface. The second plane P2 faces the first plane P1.

The first direction and the second direction are directions parallel to the first plane P1. The second direction is a direction intersecting the first direction. The second direction is a direction perpendicular to, for example, the first direction. In addition, a third direction is a direction perpendicular to the first plane. The third direction is a direction perpendicular to the first direction and the second direction.

Hereinafter, the term "depth" denotes a depth based on the first plane P1. That is, the depth denotes a distance in the third direction based on the first plane P1.

The silicon layer 10 is made of single crystal silicon (Si). The front surface of the silicon layer 10 is, for example, a surface inclined by 0 degrees or more and 8 degrees or less with respect to the (100) plane.

The n$^+$-type drain region 36 is provided in the silicon layer 10. The drain region 36 contains n-type impurities. The n-type impurity is, for example, phosphorus (P) or arsenic (As). The n-type impurity concentration is, for example, $1 \times 10^{18}$ cm$^{-3}$ or more and $1 \times 10^{21}$ cm$^{-3}$ or less.

The n$^-$-type drift region 38 is provided in the silicon layer 10. The drift region 38 is provided between the drain region 36 and the first plane P1. The drift region 38 is provided on the drain region 36.

The drift region 38 contains n-type impurities. The n-type impurity is, for example, phosphorus (P) or arsenic (As). The n-type impurity concentration is, for example, $1 \times 10^{15}$ cm$^{-3}$ or more and $1 \times 10^{18}$ cm$^{-3}$ or less. The drift region 38 is, for example, an epitaxial growth layer formed by epitaxial growth on the n$^+$-type drain region 36.

The thickness of the drift region 38 in the third direction is, for example, 7 μm or more and 15 μm or less.

The p-type body region 40 is provided in the silicon layer 10. The body region 40 is provided between the drift region 38 and the first plane P1. During the time of on-operation of the MOSFET 100, a channel is formed in a region which is in contact with the gate insulating layer 18.

The body region 40 contains p-type impurities. The p-type impurity is, for example, boron (B). The p-type impurity concentration is, for example, $1 \times 10^{16}$ cm$^{-3}$ or more and $1 \times 10^{18}$ cm$^{-3}$ or less.

A portion of the body region 40 is in contact with source electrode 12 on the first plane P1. The p-type impurity concentration of the body region 40 of the portion being in contact with the source electrode 12 is, for example, higher than the p-type impurity concentration of the other portions. By increasing the p-type impurity concentration, the contact resistance of the source electrode 12 and the body region 40 is reduced.

The n$^+$-type source region 42 is provided in the silicon layer 10. The source region 42 is provided between the body region 40 and the first plane P1.

The source region 42 contains n-type impurities. The n-type impurity is, for example, phosphorus (P) or arsenic (As). The n-type impurity concentration is, for example, $1 \times 10^{19}$ cm$^{-3}$ or more and $1 \times 10^{21}$ cm$^{-3}$ or less.

The first trench 32 exists in the silicon layer 10. The first trench 32 is located on the side of the silicon layer 10 closer to the first plane P1. The first trench 32 is a groove formed in the silicon layer 10.

The first trench 32 penetrates the body region 40 and reaches the drift region 38. The depth of the first trench 32 is, for example, 4 µm or more and 6 µm or less.

The second trench 34 exists in the silicon layer 10. The second trench 34 is located on the side of the silicon layer 10 closer to the first plane P1. The second trench 34 is a groove formed in the silicon layer 10.

The second trench 34 penetrates the body region 40 and reaches the drift region 38. The depth of the second trench 34 is, for example, 4 µm or more and 6 µm or less. The depth of the second trench 34 is equal to the depth of, for example, the first trench 32.

As illustrated in FIG. 3, the first trench 32 has a mesh-shaped pattern on the first plane P1. The mesh-shaped pattern can be referred to as a lattice-shaped pattern or a network-shaped pattern.

A portion of the first trench 32 extends in the first direction. In addition, another portion of the first trench 32 extends in the second direction. The portion extending in the first direction and the portion extending in the second direction intersect each other to form the mesh-shaped pattern. The shape of the first trench 32 is a mesh shape.

In the first plane P1, the shape of the region (R in FIG. 3) surrounded by the first trench 32 is a square.

The second trench 34 is surrounded by the first trench 32. The second trench 34 is located in the region R surrounded by the first trench 32 on the first plane P1. The second trench 34 is, for example, rectangular on the first plane P1. The shape of the second trench 34 is, for example, a pillar shape.

The gate electrode 16 is provided in the first trench 32. The gate electrode 16 is made of, for example, polycrystalline silicon containing an n-type impurity or a p-type impurity.

The gate insulating layer 18 is provided between the gate electrode 16 and the silicon layer 10. The gate insulating layer 18 is provided between the gate electrode 16 and the body region 40. the gate insulating layer 18 is made of, for example, silicon oxide.

The first field plate electrode 20 is provided in the first trench 32. The first field plate electrode 20 is provided between the gate electrode 16 and the second plane P2. The first field plate electrode 20 is made of, for example, polycrystalline silicon containing an n-type impurity or a p-type impurity.

The first field plate electrode 20 has a mesh shape.

The first field plate electrode 20 has a function of changing the electric field distribution in the drift region 38 and improving the breakdown voltage of the MOSFET 100 during the time of off-operation of the MOSFET 100.

The first field plate insulating layer 22 is provided between the first field plate electrode 20 and the silicon layer 10. The first field plate insulating layer 22 is provided between the first field plate electrode 20 and the drift region 38. The first field plate insulating layer 22 is made of, for example, silicon oxide.

The thickness of the first field plate insulating layer 22 is larger than, for example, the thickness of the gate insulating layer 18. The thickness of the first field plate insulating layer 22 is, for example, 5 times or more of the thickness of the gate insulating layer 18.

The intermediate insulating layer 24 is provided between the gate electrode 16 and the first field plate electrode 20.

The intermediate insulating layer 24 has a function of electrically separating the gate electrode 16 from the first field plate electrode 20.

The second field plate electrode 26 is provided in the second trench 34. The second field plate electrode 26 is in contact with the source electrode 12. The second field plate electrode 26 is made of, for example, polycrystalline silicon containing an n-type impurity or a p-type impurity.

The second field plate electrode 26 has a function of changing the electric field distribution in the drift region 38 and improving the breakdown voltage of the MOSFET 100 during the time of off-operation of the MOSFET 100.

The second field plate electrode 26 has a pillar shape.

The second field plate insulating layer 28 is provided between the second field plate electrode 26 and the silicon layer 10. The second field plate insulating layer 28 is provided between the second field plate electrode 26 and the drift region 38. The second field plate electrode 26 is made of, for example, silicon oxide.

The thickness of the second field plate insulating layer 28 is larger than, for example, the thickness of the gate insulating layer 18. The thickness of the second field plate insulating layer 28 is, for example, 5 times or more of the thickness of the gate insulating layer 18.

The interlayer insulating layer 30 is provided between the gate electrode 16 and the source electrode 12. The interlayer insulating layer 30 has a function of electrically separating the gate electrode 16 from the source electrode 12. The interlayer insulating layer 30 is made of, for example, silicon oxide.

The source electrode 12 is provided on the side of the silicon layer 10 closer to the first plane P1. The source electrode 12 is provided on the first plane P1 of the silicon layer 10. The source electrode 12 is electrically connected to the source region 42 and the body region 40. The source electrode 12 is in contact with the source region 42 and the body region 40.

The source electrode 12 is electrically connected to the first field plate electrode 20 and the second field plate electrode 26. The source electrode 12 is in contact with, for example, the second field plate electrode 26.

The source electrode 12 is a metal electrode. The source electrode 12 is, for example, a stacked film of titanium (Ti) and aluminum (Al).

The drain electrode 14 is provided on the side of the silicon layer 10 closer to the second plane P2. The drain electrode 14 is provided on the second plane P2 of the silicon layer 10. The drain electrode 14 is electrically connected to the drain region 36. The drain electrode 14 is in contact with the drain region 36.

The drain electrode 14 is a metal electrode. The drain electrode 14 is a stacked film made of, for example, titanium (Ti), aluminum (Al), nickel (Ni), copper (Cu), silver (Ag), gold (Au), and the like.

Hereinafter, the function and effect of the semiconductor device according to the first embodiment will be described.

Figure 4:
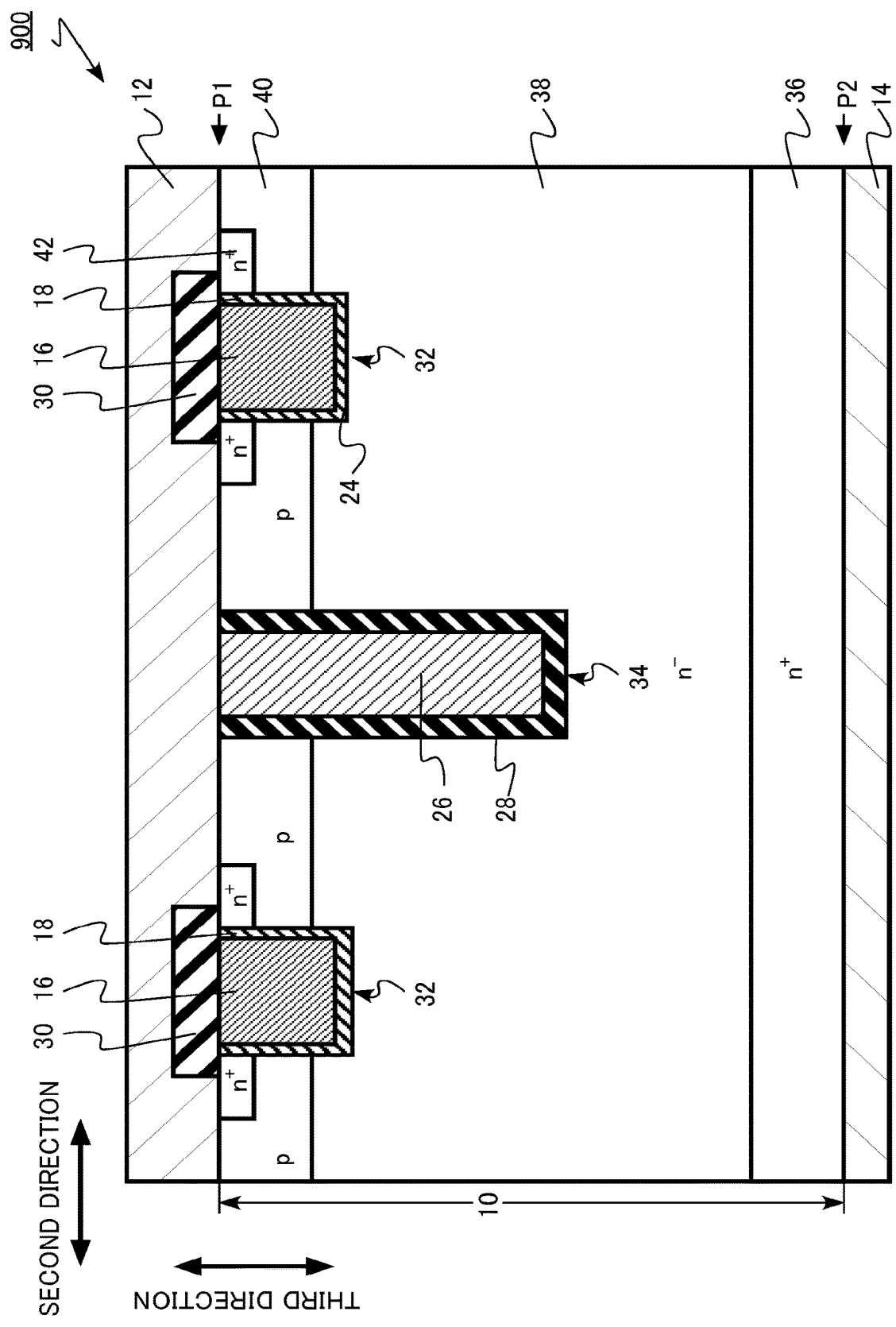
FIG. 4 is a schematic cross-sectional view of a semiconductor device according to Comparative Example.

FIG. 4 is a schematic cross-sectional view of a semiconductor device according to Comparative Example. The semiconductor device according to Comparative Example is a vertical type transistor where a gate electrode is buried in a trench. The semiconductor device according to Comparative Example is a MOSFET 900.

The MOSFET 900 is different from the MOSFET 100 according to the first embodiment from the point of view that the MOSFET 900 does not include the first field plate electrode 20.

In the vertical type transistor, the breakdown voltage and the on-resistance have a trade-off relationship. That is, if the impurity concentration of the drift region is increased in order to reduce the on-resistance, the breakdown voltage is decreased. On the contrary, if the impurity concentration of the drift region is decreased in order to improve the breakdown voltage, the on-resistance is increased.

In the MOSFET 900, in order to improve the trade-off between the breakdown voltage and the on-resistance, the second field plate electrode 26 is provided in the second trench 34. By changing the electric field distribution in the drift region 38 by using the second field plate electrode 26, for example, while the breakdown voltage is maintained, the n-type impurity concentration of drift region 38 can be increased. Therefore, while the breakdown voltage is maintained, it is possible to reduce the on-resistance.

Figure 5:
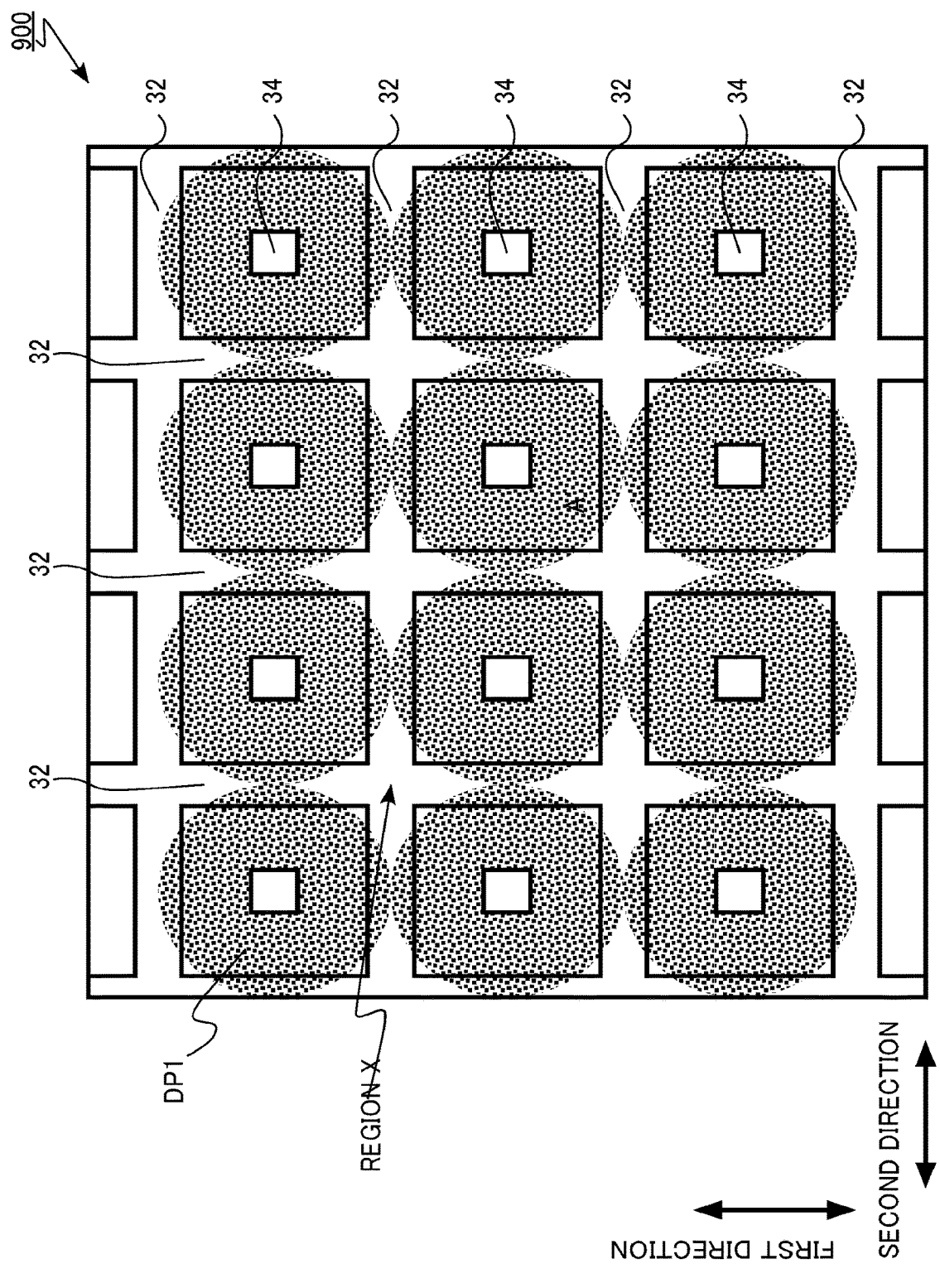
FIG. 5 is a diagram illustrating functions and effects of the first embodiment.

FIG. 5 is a diagram illustrating the functions and effects of the first embodiment. FIG. 5 is a schematic plan view of the semiconductor device according to Comparative Example. FIG. 5 schematically illustrates a depletion layer DP1 extending in the drift region 38 from the second field plate electrode 26 during the time of off-operation of the MOSFET 900.

As illustrated in FIG. 5, the depletion layer DP1 extends in the drift region 38 from the second trench 34 having the second field plate electrode 26. However, in particular, the distance between the two second trenches 34 located obliquely is large, and the drift region 38 (region X in FIG. 5) between the two second trenches 34 located obliquely is hard to deplete. For this reason, then-type impurity concentration of the region X cannot be increased, and the on-resistance cannot be sufficiently reduced.

Unlike the MOSFET 900, the MOSFET 100 includes the first field plate electrode 20 in the first trench 32.

Figure 6:
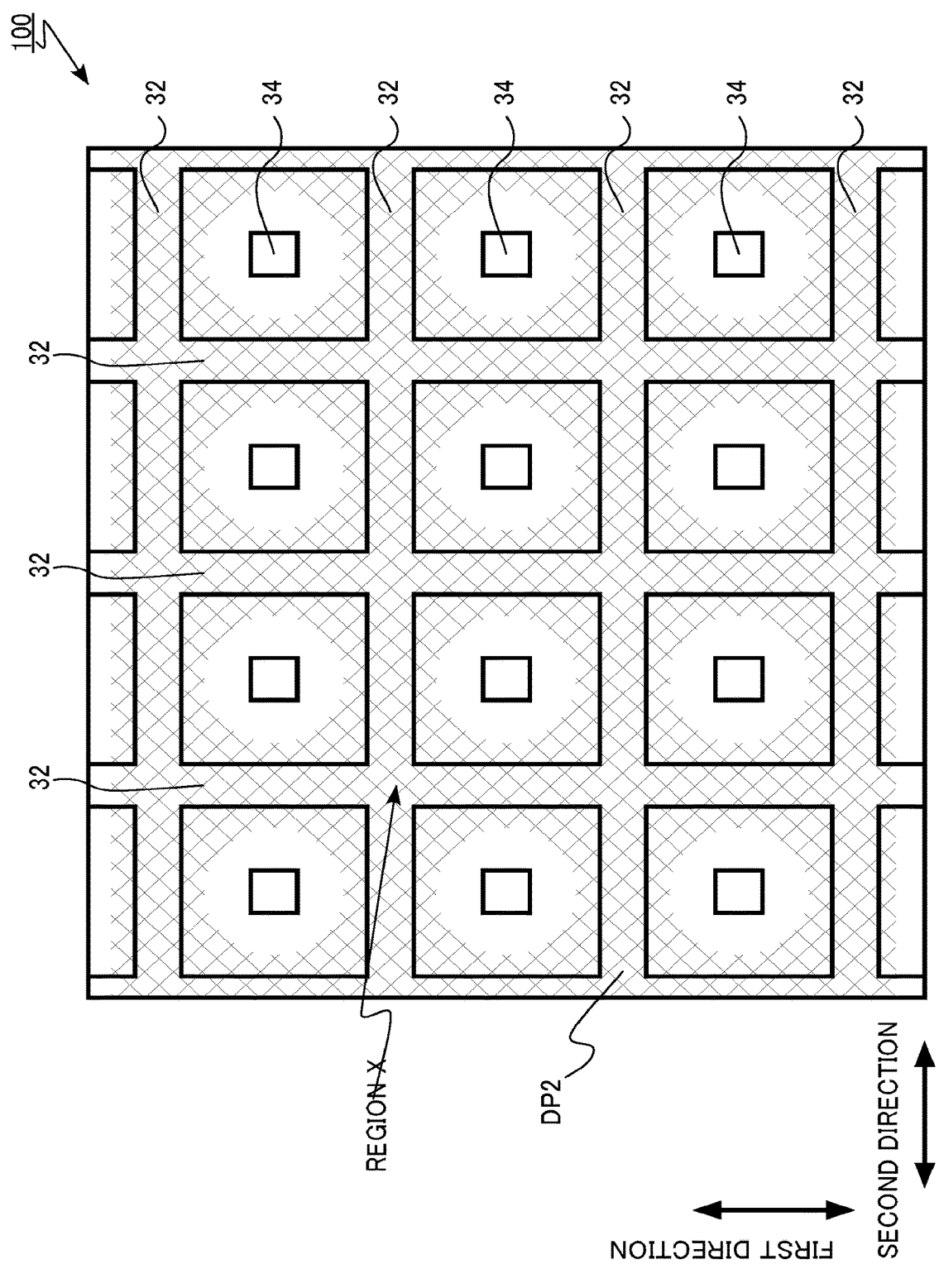
FIG. 6 is a diagram illustrating functions and effects of the first embodiment.
Figure 7:
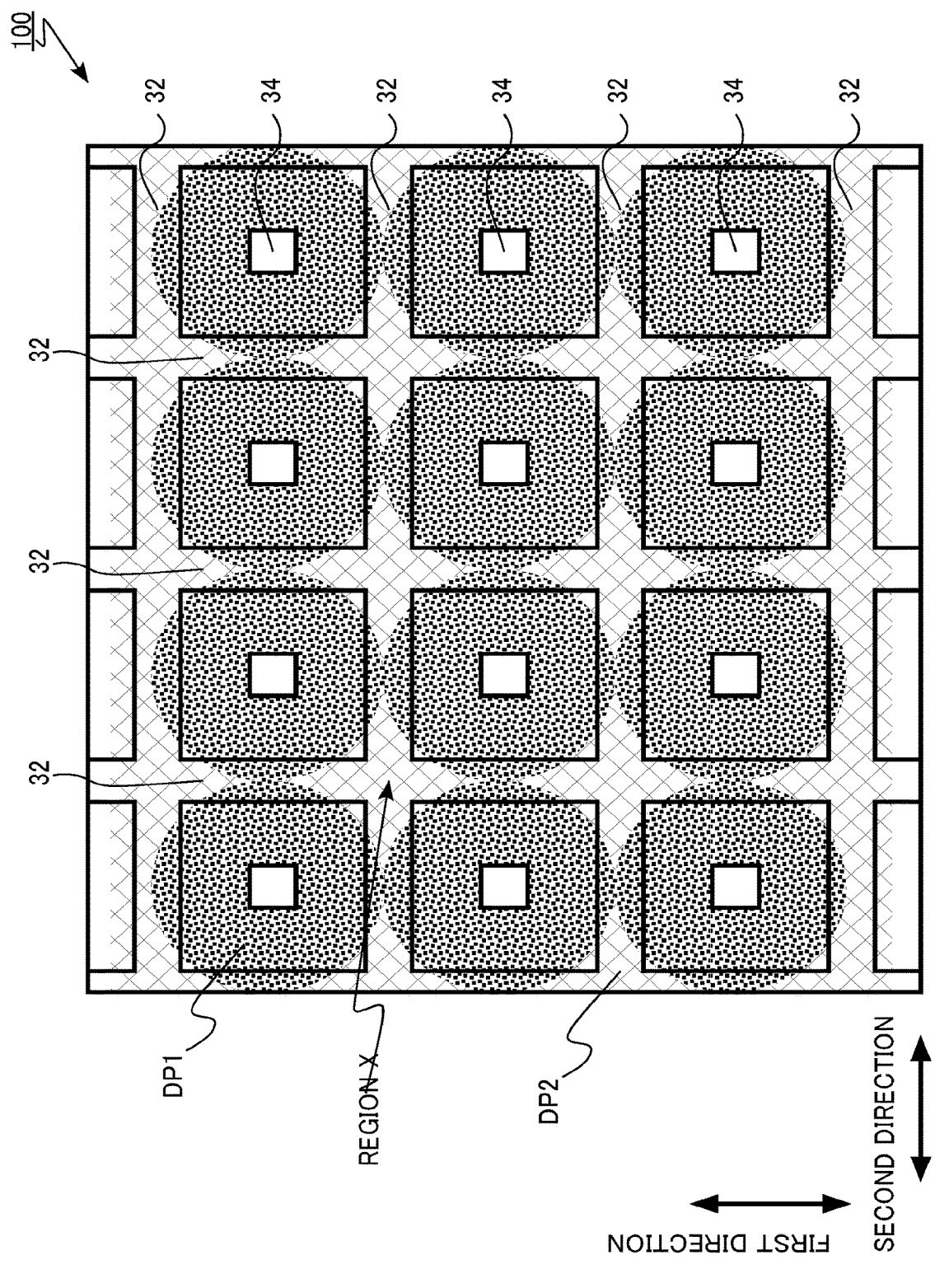
FIG. 7 is a diagram illustrating functions and effects of the first embodiment.

FIGS. 6 and 7 are diagrams illustrating the functions and effects of the first embodiment. FIGS. 6 and 7 are schematic plan views of the semiconductor device according to the first embodiment. FIGS. 6 and 7 illustrate depletion layers extending in the drift region 38 during the time of off-operation of the MOSFET 100.

FIG. 6 schematically illustrates a depletion layer DP2 extending in the drift region 38 from the first field plate electrode 20 during the time of off-operation of the MOSFET 100. In addition, in FIG. 6, the depletion layer DP1 extending in the drift region 38 from the second field plate electrode 26 is omitted in illustration. FIG. 7 illustrates the depletion layer DP1 extending in the drift region 38 from the second field plate electrode 26 in addition to the depletion layer DP2 extending in the drift region 38 from the first field plate electrode 20 during the time of off-operation of the MOSFET 100.

As illustrated in FIGS. 6 and 7, the depletion layer DP2 extending in the drift region 38 from the first field plate electrode 20 extends in the drift region 38 (region X in FIGS. 6 and 7) between the two second trenches 34 located diagonally. In particular, in the region X, the first field plate electrode 20 extending in the first direction and the first field plate electrode 20 extending in the second direction intersect each other. By allowing the intersecting first field plate electrodes 20 to complement each other, the depletion of the region X is promoted.

Therefore, in the MOSFET 100, it is possible to increase the n-type impurity concentration of the drift region 38 in the region X as compared with the MOSFET 900. Accordingly, it is possible to further reduce the on-resistance as compared with the MOSFET 900.

In addition, in the MOSFET 100, the first field plate electrode 20 is provided under the gate electrode 16. For this reason, as compared with the MOSFET 900 according to Comparative Example, the distance between the gate electrode 16 and the drift region 38 is increased. Therefore, the capacitance (Cgd) between the gate electrode 16 and the drift region 38 is reduced. Accordingly, the switching loss of the MOSFET 100 is reduced.

It is preferable that the thickness of the first field plate insulating layer 22 of the portion intersecting the first field plate electrode 20 is smaller than the thickness of the first field plate insulating layer 22 of the other portions.

Since the depletion of the drift region 38 in the region X is further promoted, it is possible to further increase the n-type impurity concentration of the region X. Therefore, it is possible to further reduce, the on-resistance of the MOSFET 100.

As described above, according to the first embodiment, it is possible to realize a MOSFET capable of reducing on-resistance. In addition, it is possible to realize a MOSFET capable of reducing switching loss.

Second Embodiment

A semiconductor device according to a second embodiment is different from the semiconductor device according to the first embodiment from the point of view that the semiconductor device according to the second embodiment further includes a first metal region being provided in the second trench, being in contact with the second semiconductor region in the side surface of the second trench, and being electrically connected to the first electrode. Hereinafter, in some cases, a portion of contents overlapping with the semiconductor device according to the first embodiment may be omitted in description.

The semiconductor device according to the second embodiment is a vertical type transistor where a gate electrode is buried in a trench. The semiconductor device according to the second embodiment is a vertical type power MOSFET. The semiconductor device according to the second embodiment is a MOSFET 200.

Figure 8:
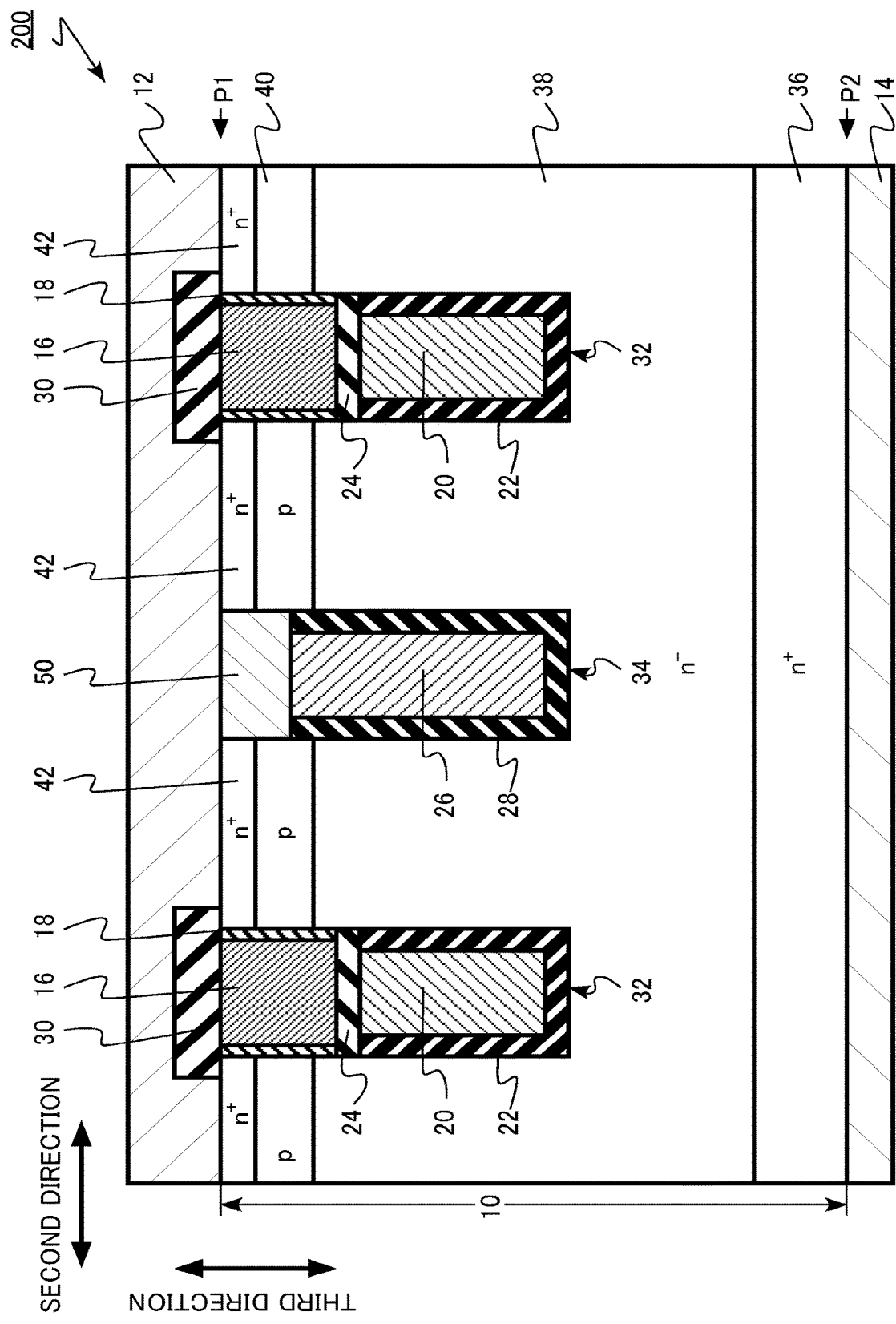
FIG. 8 is a schematic cross-sectional view of a semiconductor device according to a second embodiment.

FIG. 8 is a schematic cross-sectional view of the semiconductor device according to the second embodiment. FIG. 8 is a view according to FIG. 2 of the first embodiment.

The MOSFET 200 includes a silicon layer 10 (semiconductor layer), a source electrode 12 (first electrode), a drain electrode 14 (second electrode), a gate electrode 16, a gate insulating layer 18, a first field plate electrode 20, a first field plate insulating layer 22 (first insulating layer), an intermediate insulating layer 24, a second field plate electrode 26, a second field plate insulating layer 28 (second insulating layer), an interlayer insulating layer 30, and a first contact electrode 50 (first metal region).

The silicon layer 10 includes a first trench 32, a second trench 34, an n$^+$-type drain region 36, an n$^-$-type drift region 38 (first semiconductor region), a p-type body region 40 (second semiconductor region), and an n$^+$-type source region 42 (third semiconductor region).

The first contact electrode 50 is provided in the second trench 34. The first contact electrode 50 is in contact with the body region 40 on the side surface of the second trench 34. The first contact electrode 50 is in contact with the source region 42 on the side surface of the second trench 34. The first contact electrode 50 is in contact with the second field plate electrode 26. The first contact electrode 50 is electrically connected to the source electrode 12. The first contact electrode 50 is in contact with, for example, the source electrode 12.

The first contact electrode 50 has a function of electrically connecting the source electrode 12 and the body region 40. The first contact electrode 50 has a function of electrically connecting the source electrode 12 and the second field plate electrode 26.

The first contact electrode 50 is made of a metal. The first contact electrode 50 is made of, for example, tungsten, titanium, titanium nitride, or aluminum.

By providing the first contact electrode 50, it is unnecessary to connect the source electrode 12 and the body region 40 on the first plane P1. Therefore, it is possible to reduce, for example, the distance between the first trench 32 and the second trench 34. By reducing the distance between the first trench 32 and the second trench 34, for example, it is possible to further reduce the on-resistance.

In addition, the first contact electrode 50 can be formed simultaneously with the source electrode 12. In this case, for example, the first contact electrode 50 and the source electrode 12 are made of consecutive identical materials. In this case, the first contact electrode 50 is a portion of the source electrode 12.

As described above, according to the second embodiment, it is possible to realize a MOSFET capable of reducing on-resistance.

Third Embodiment

A semiconductor device according to a third embodiment is different from the semiconductor device according to the first embodiment from the point of view that, in the semiconductor device according to the third embodiment, the thickness of the second insulating layer is larger than the thickness of the first insulating layer. Hereinafter, in some cases, a portion of contents overlapping with the semiconductor device according to the first embodiment may be omitted in description.

The semiconductor device according to the third embodiment is a vertical type transistor where a gate electrode is buried in a trench. The semiconductor device according to the third embodiment is a vertical type power MOSFET. The semiconductor device according to the third embodiment is a MOSFET 300.

Figure 9:
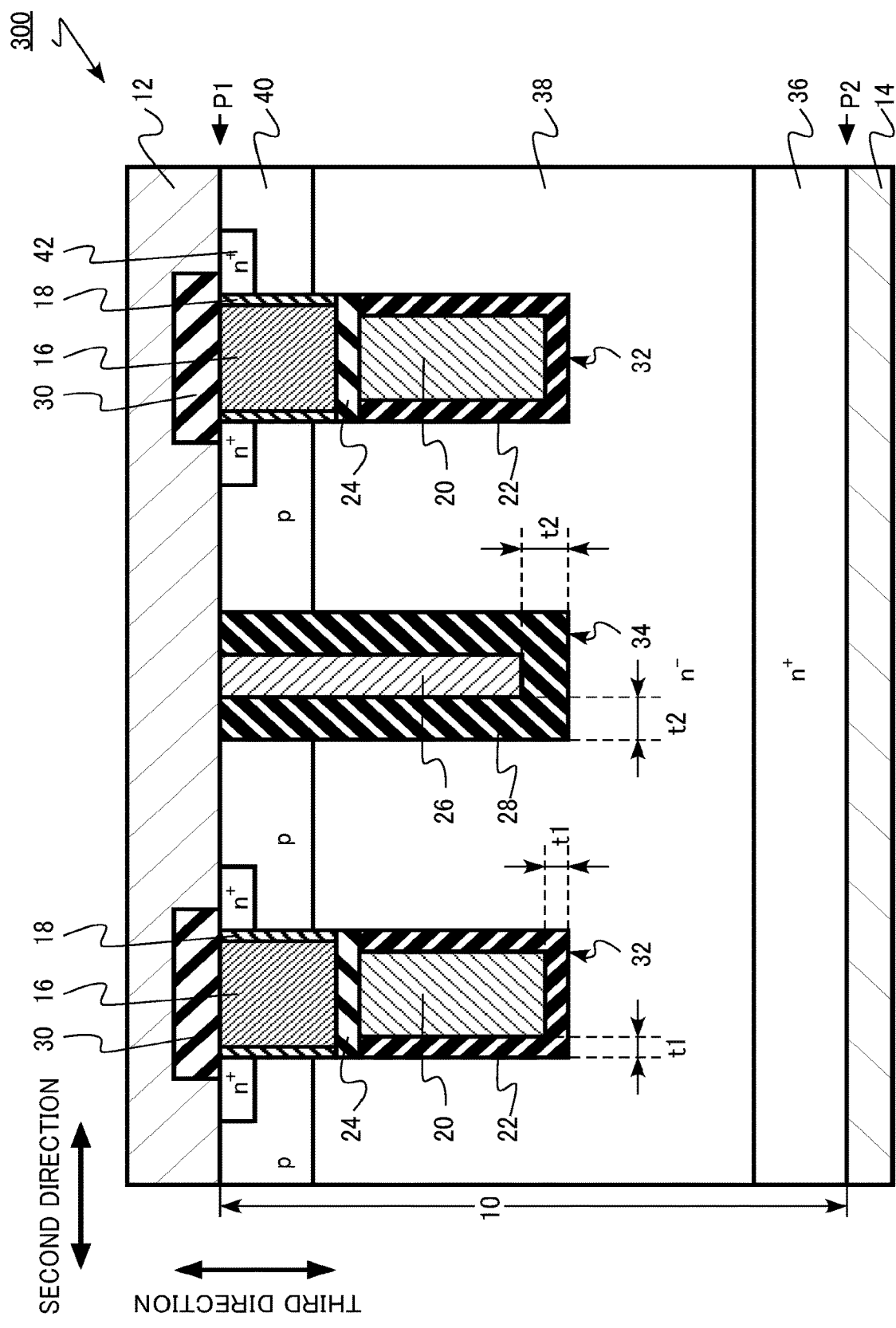
FIG. 9 is a schematic cross-sectional view of a semiconductor device according to a third embodiment.

FIG. 9 is a schematic cross-sectional view of the semiconductor device according to the third embodiment. FIG. 9 is a view according to FIG. 2 of the first embodiment.

The MOSFET 300 includes a silicon layer 10 (semiconductor layer), a source electrode 12 (first electrode), a drain electrode 14 (second electrode), a gate electrode 16, a gate insulating layer 18, a first field plate electrode 20, a first field plate insulating layer 22 (first insulating layer), an intermediate insulating layer 24, a second field plate electrode 26, a second field plate insulating layer 28 (second insulating layer), and an interlayer insulating layer 30.

The silicon layer 10 includes a first trench 32, a second trench 34, an n$^+$-type drain region 36, an n$^-$-type drift region 38 (first semiconductor region), a p-type body region 40 (second semiconductor region), and an n$^+$-type source region 42 (third semiconductor region).

The thickness (t2 in FIG. 9) of the second field plate insulating layer 28 is larger than the thickness (t1 in FIG. 9) of the first field plate insulating layer 22. For example, the thickness of the bottom portion of the second trench 34 of the second field plate insulating layer 28 is larger than the thickness of the bottom of the first trench 32 in the first field plate insulating layer 22. In addition, for example, the thickness of the side surface portion of the second trench 34 of the second field plate insulating layer 28 is larger than the thickness of the side surface portion of the first trench 32 in the first field plate insulating layer 22.

A higher electric field is applied to the second field plate insulating layer 28 provided between the second field plate electrode 26 having a pillar shape and the silicon layer 10 than to the first field plate insulating layer 22 provided between the first field plate electrode 20 having a mesh shape and the silicon layer 10. In particular, a high electric field is applied to the second field plate insulating layer 28 of the bottom of the second trench 34.

In the MOSFET 300, the thickness t2 of the second field plate insulating layer 28 is larger than the thickness t1 of the first field plate insulating layer 22. For this reason, the electric field strength applied to the second field plate insulating layer 28 is relaxed. Therefore, dielectric breakdown resistance of the second field plate insulating layer 28 is improved, and thus, the reliability is improved. Accordingly, the reliability of the MOSFET 300 is improved.

As described above, according to the third embodiment, it is possible to realize a MOSFET capable of reducing on-resistance. In addition, it is possible to realize a MOSFET having improved reliability.

Fourth Embodiment

A semiconductor device according to a fourth embodiment is different from the semiconductor device according to the first embodiment from the point of view that, in the semiconductor device according to the fourth embodiment, the first distance from the second plane to the first trench is larger than the second distance from the second plane to the second trench. Hereinafter, in some cases, a portion of contents overlapping with the semiconductor device according to the first embodiment may be omitted in description.

The semiconductor device according to the fourth embodiment is a vertical type transistor where a gate electrode is buried in a trench. The semiconductor device according to the fourth embodiment is a vertical type power MOSFET. The semiconductor device according to the fourth embodiment is a MOSFET 400.

Figure 10:
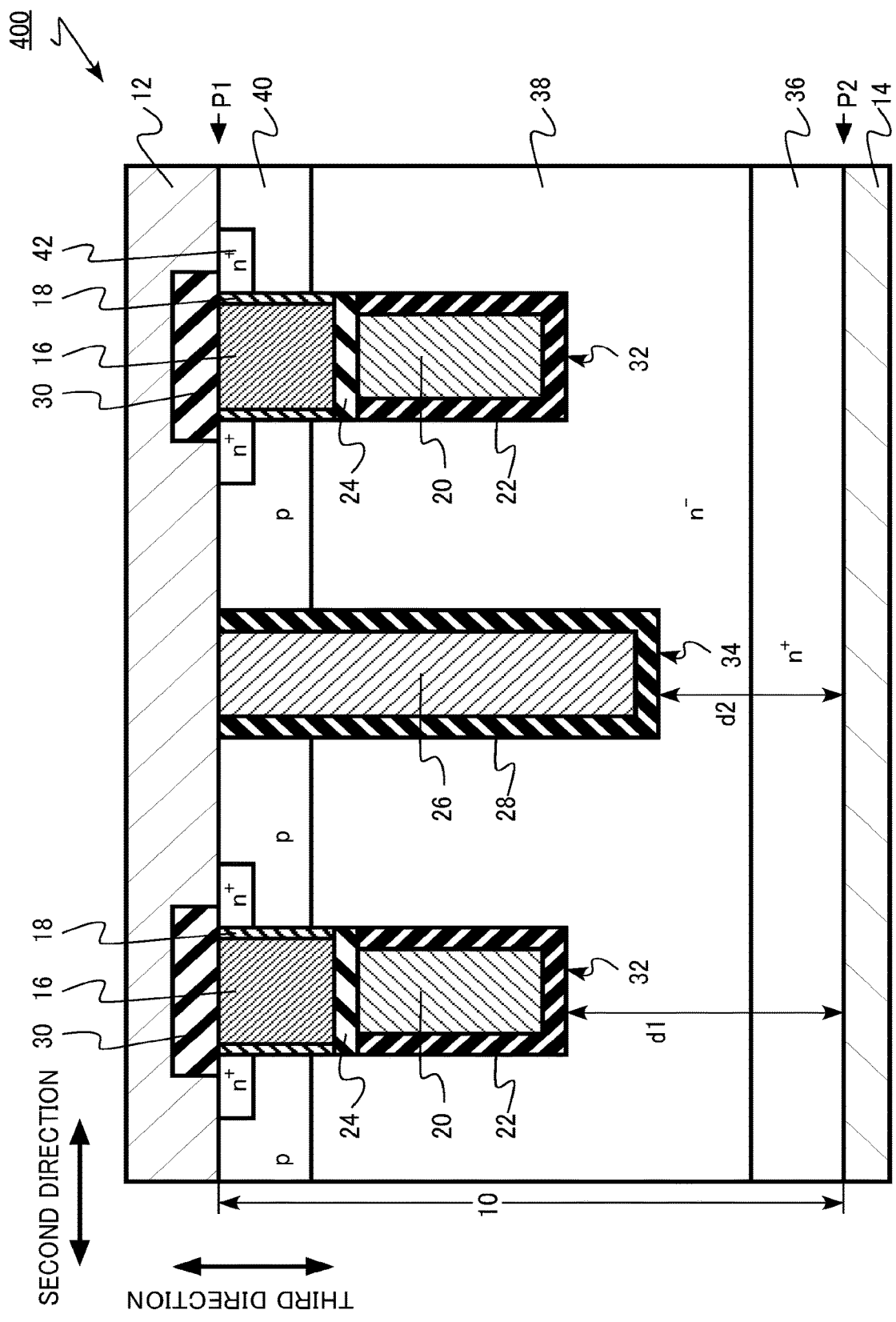
FIG. 10 is a schematic cross-sectional view of a semiconductor device according to a fourth embodiment.

FIG. 10 is a schematic cross-sectional view of the semiconductor device according to the fourth embodiment. FIG. 10 is a view according to FIG. 2 of the first embodiment.

The MOSFET 400 includes a silicon layer 10 (semiconductor layer), a source electrode 12 (first electrode), a drain electrode 14 (second electrode), a gate electrode 16, a gate insulating layer 18, a first field plate electrode 20, a first field plate insulating layer 22 (first insulating layer), an intermediate insulating layer 24, a second field plate electrode 26, a second field plate insulating layer 28 (second insulating layer), and an interlayer insulating layer 30.

The silicon layer 10 includes a first trench 32, a second trench 34, an n$^+$-type drain region 36, an n$^-$-type drift region 38 (first semiconductor region), a p-type body region 40 (second semiconductor region), and a n$^+$-type source region 42 (third semiconductor region).

In the MOSFET 400, the first distance from the second plane P2 to the first trench 32 (d1 in FIG. 10) is larger than the second distance from the second plane P2 to the second trench 34 (d2 in FIG. 10). In other words, the depth of the second trench 34 is larger than the depth of the first trench 32.

The depth of the second trench 34 is, for example, 1.1 times or more and 2 times or less of the depth of the first trench 32.

By increasing the depth of the second trench 34, the extension of the depletion layer DP1 extending from second field plate electrode 26 to the drift region 38 is increased. Therefore, it is possible to further increase the n-type impurity concentration of the drift region 38. Accordingly, it is possible to further reduce the on-resistance.

As described above, according to the fourth embodiment, it is possible to further realize a MOSFET capable of reducing on-resistance.

Fifth Embodiment

A semiconductor device according to a fifth embodiment is different from the semiconductor device according to the first embodiment from the point of view that, in the semiconductor device according to the fifth embodiment, at least a portion of the first trench extends in the first direction on the first plane, and the first width of the at least portion in a second direction perpendicular to the first direction is smaller than the second width of the second trench in the second direction. Hereinafter, in some cases, a portion of contents overlapping with the semiconductor device according to the first embodiment may be omitted in description.

The semiconductor device according to the fifth embodiment is a vertical type transistor where a gate electrode is buried in a trench. The semiconductor device according to the fifth embodiment is a vertical type power MOSFET. The semiconductor device according to the fifth embodiment is a MOSFET 500.

Figure 11:
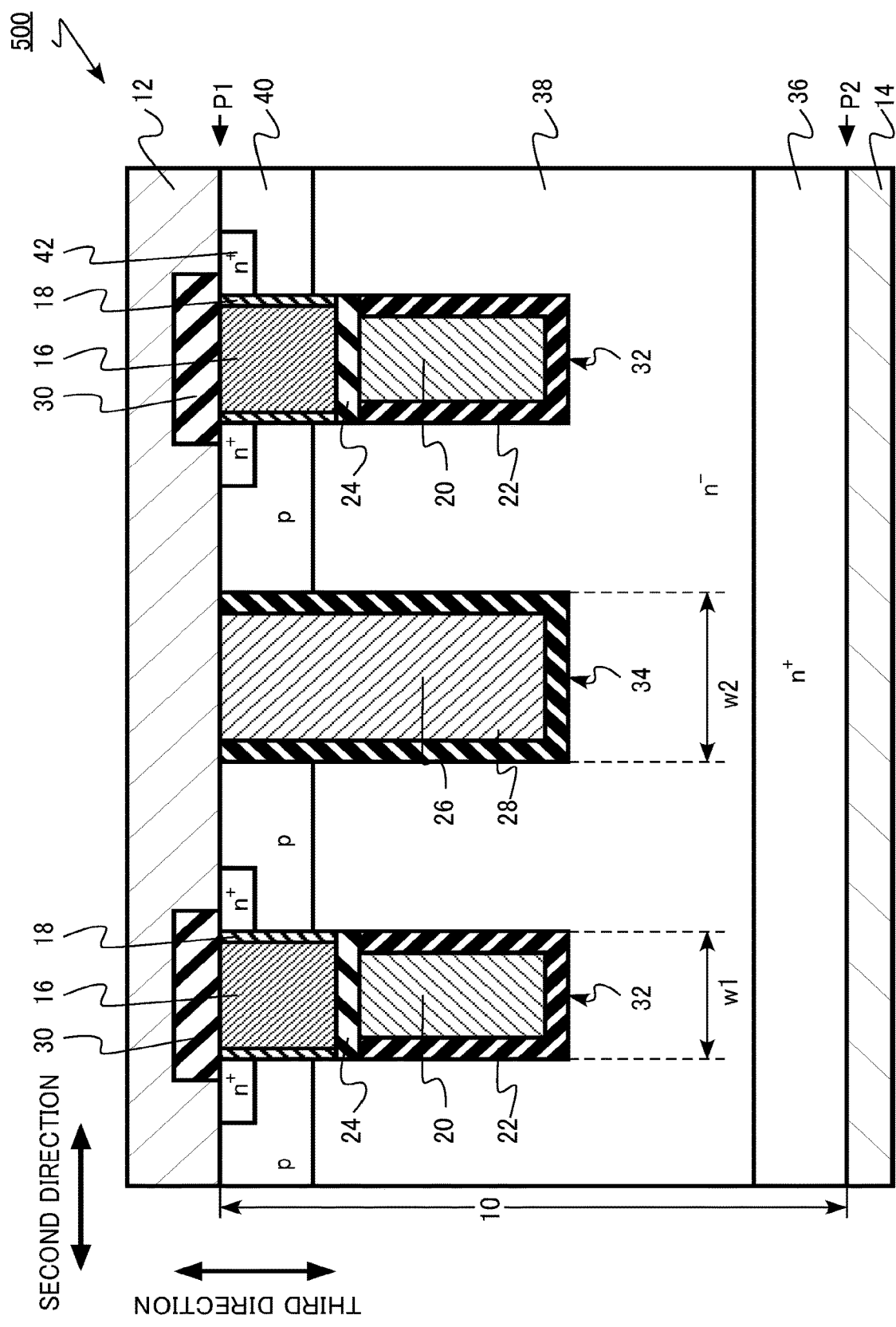
FIG. 11 is a schematic cross-sectional view of a semiconductor device according to a fifth embodiment.

FIG. 11 is a schematic cross-sectional view of the semiconductor device according to the fifth embodiment. FIG. 11 is a view according to FIG. 2 of the first embodiment.

The MOSFET 500 includes a silicon layer 10 (semiconductor layer), a source electrode 12 (first electrode), a drain electrode 14 (second electrode), a gate electrode 16, a gate insulating layer 18, a first field plate electrode 20, a first field plate insulating layer 22 (first insulating layer), an intermediate insulating layer 24, a second field plate electrode 26, a second field plate insulating layer 28 (second insulating layer), and an interlayer insulating layer 30.

The silicon layer 10 includes a first trench 32, a second trench 34, an n$^+$-type drain region 36, an n$^-$-type drift region 38 (first semiconductor region), and a p-type body region 40 (second semiconductor region), and an n$^+$-type source region 42 (third semiconductor region).

In the MOSFET 500, the first width (w1 in FIG. 11) of the first trench 32 in the second direction perpendicular to the first direction is smaller than the second width (w2 in FIG. 11) of the second trench 34 in the second direction. In other words, the second width w2 of the second trench 34 is larger than the first width w1 of the first trench 32.

The second width w2 of the second trench 34 is, for example, 1.1 times or more and 2 times or less of the first width w1 of the first trench 32.

Since the second trench 34 has a pillar shape, it is difficult to bury a film for forming a field plate insulating layer or a field plate electrode in the second trench 34 as compared with the first trench 32 having a mesh shape. By increasing the second width w2 of the second trench 34, burying the film in the second trench 34 is easily performed. Accordingly, manufacturing the MOSFET 500 is easily performed.

As described above, according to the fifth embodiment, it is possible to realize a MOSFET capable of reducing on-resistance. In addition, it is possible to realize a MOSFET that is easily manufactured.

Sixth Embodiment

A semiconductor device according to a sixth embodiment is different from the semiconductor device according to the first embodiment from the point of view that, in the semiconductor device according to the sixth embodiment, the second field plate electrode is made of a metal. Hereinafter, in some cases, a portion of contents overlapping with the semiconductor device according to the first embodiment may be omitted in description.

The semiconductor device according to the sixth embodiment is a vertical type transistor where a gate electrode is buried in a trench. The semiconductor device according to the sixth embodiment is a vertical type power MOSFET. The semiconductor device according to the sixth embodiment is a MOSFET 600.

Figure 12:
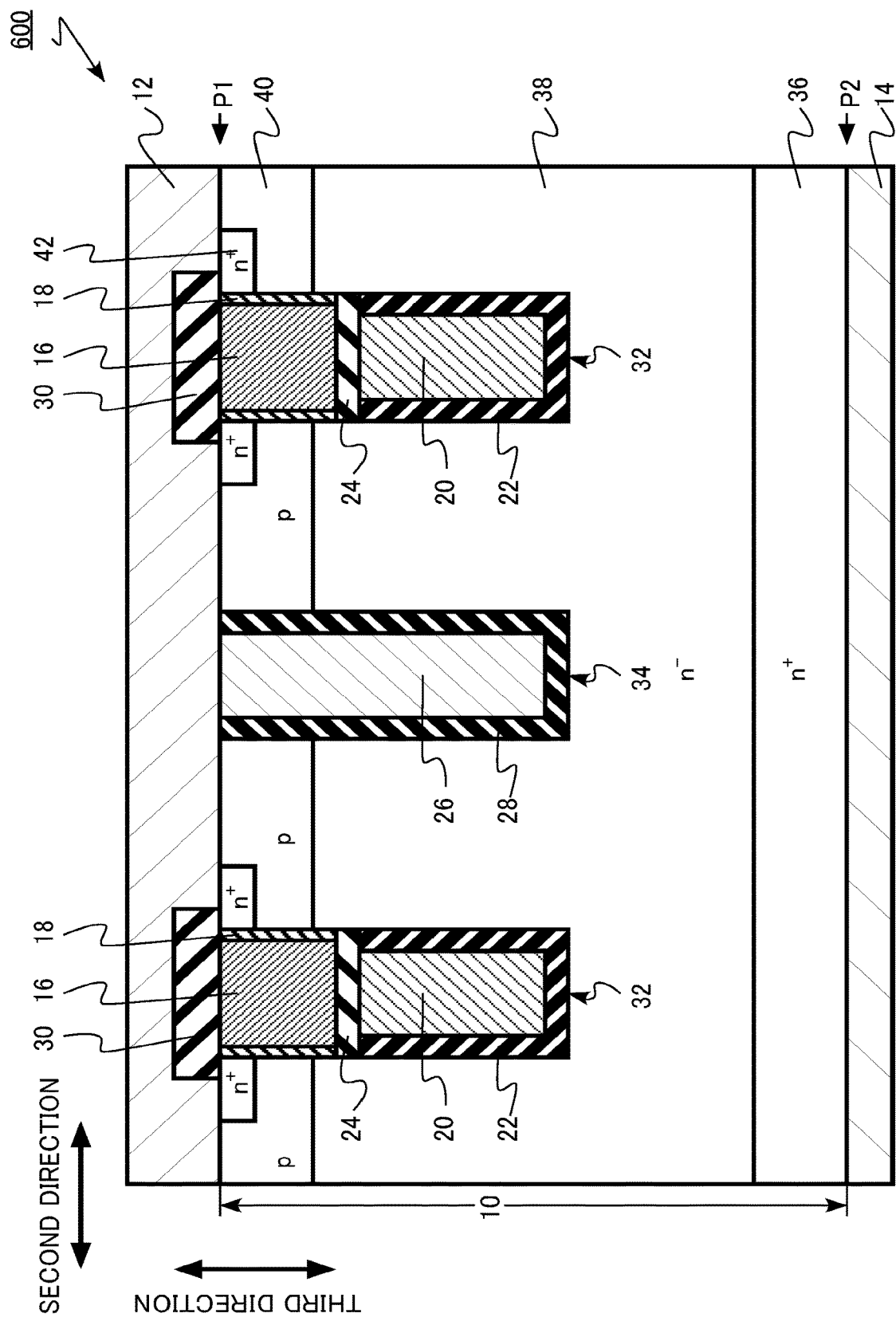
FIG. 12 is a schematic cross-sectional view of a semiconductor device according to a sixth embodiment.

FIG. 12 is a schematic cross-sectional view of the semiconductor device according to the sixth embodiment. FIG. 12 is a view according to FIG. 2 of the first embodiment.

The MOSFET 600 includes a silicon layer 10 (semiconductor layer), a source electrode 12 (first electrode), a drain electrode 14 (second electrode), a gate electrode 16, a gate insulating layer 18, a first field plate electrode 20, a first field plate insulating layer 22 (first insulating layer), an intermediate insulating layer 24, a second field plate electrode 26, a second field plate insulating layer 28 (second insulating layer), and an interlayer insulating layer 30.

The silicon layer 10 includes a first trench 32, a second trench 34, an n$^+$-type drain region 36, an n$^-$-type drift region 38 (first semiconductor region), a p-type body region 40 (second semiconductor region), and an n$^+$-type source region 42 (third semiconductor region).

In the MOSFET 600, the second field plate electrode 26 is made of a metal. The second field plate electrode 26 is made of, for example, tungsten, titanium, titanium nitride, or aluminum.

Since the second field plate electrode 26 is a metal, the electric resistance of the second field plate electrode 26 is reduced. Accordingly, for example, the switching loss of the MOSFET 600 is reduced.

As described above, according to the sixth embodiment, it is possible to realize a MOSFET capable of reducing on-resistance. In addition, it is possible to realize a MOSFET of which switching loss is reduced.

Seventh Embodiment

A semiconductor device according to a seventh embodiment is different from the semiconductor device according to the first embodiment from the point of view that, in the semiconductor device according to the seventh embodiment, the semiconductor layer has a third trench located on the side closer to the first plane and located between the first trench and the second trench, and the semiconductor device further includes a second metal region provided in the third trench, being in contact with the second semiconductor region on the side surface of the third trench, and electrically connected to the first electrode. Hereinafter, in some cases, a portion of contents overlapping with the semiconductor device according to the first embodiment may be omitted in description.

The semiconductor device according to the seventh embodiment is a vertical type transistor where a gate electrode is buried in a trench. The semiconductor device according to the seventh embodiment is a vertical type power MOSFET. The semiconductor device according to the seventh embodiment is a MOSFET 700.

Figure 13:
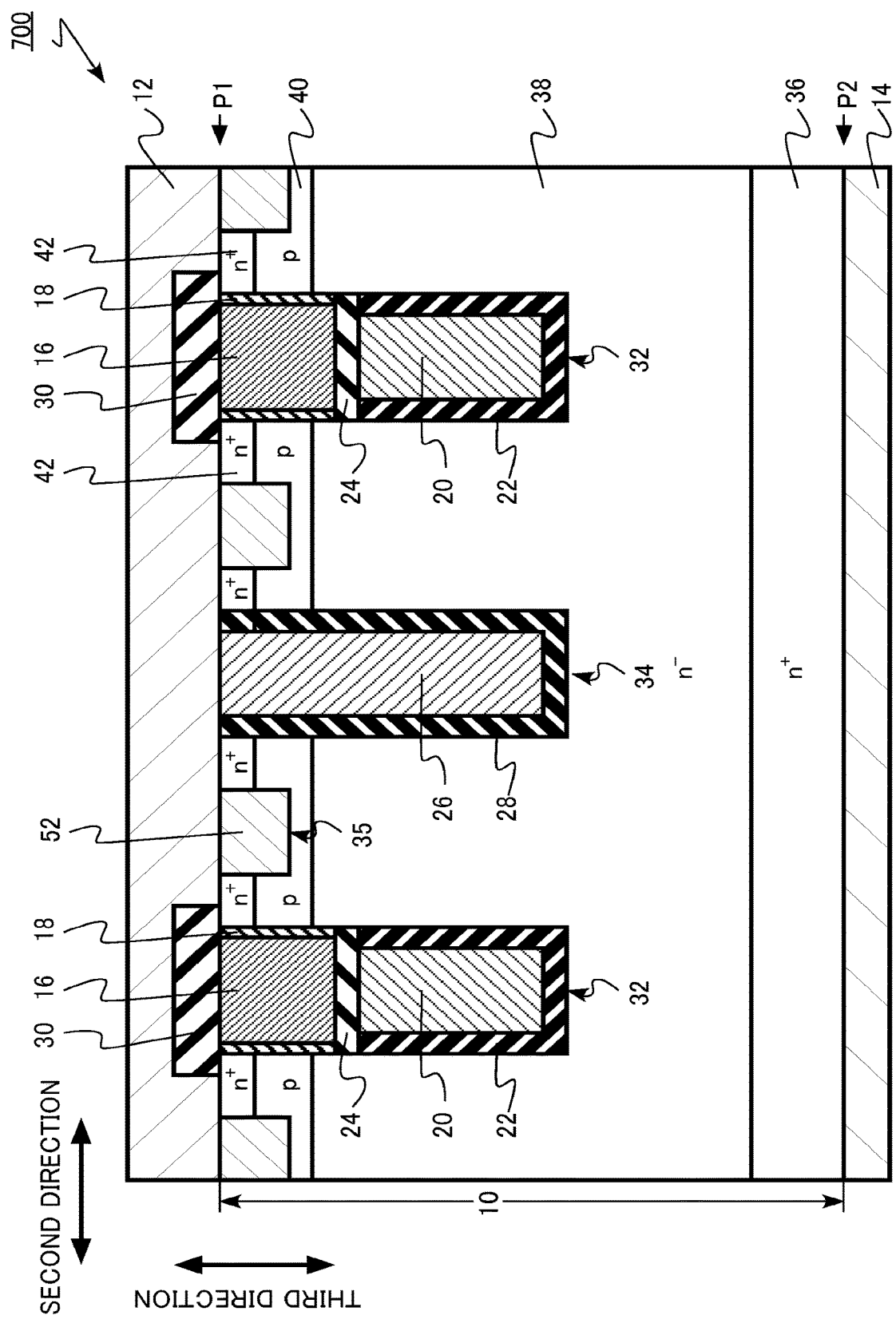
FIG. 13 is a schematic cross-sectional view of a semiconductor device according to a seventh embodiment.

FIG. 13 is a schematic cross-sectional view of the semiconductor device according to the seventh embodiment. FIG. 13 is a view according to FIG. 2 of the first embodiment.

The MOSFET 700 includes a silicon layer 10 (semiconductor layer), a source electrode 12 (first electrode), a drain electrode 14 (second electrode), a gate electrode 16, a gate insulating layer 18, a first field plate electrode 20, a first field plate insulating layer 22 (first insulating layer), an intermediate insulating layer 24, a second field plate electrode 26, a second field plate insulating layer 28 (second insulating layer), an interlayer insulating layer 30, and a second contact electrode 52 (second metal region).

The silicon layer 10 includes a first trench 32, a second trench 34, a third trench 35, an n$^+$-type drain region 36, an n$^-$-type drift region 38 (first semiconductor region), a p-type body region 40 (second semiconductor region), and an n$^+$-type source region 42 (third semiconductor region).

In the MOSFET 700, the silicon layer 10 has the third trench 35. The third trench 35 exists in the silicon layer 10. The third trench 35 is located on the side of the silicon layer 10 closer to the first plane P1. The third trench 35 is a groove formed in the silicon layer 10.

The third trench 35 is located between the first trench 32 and the second trench 34. The third trench 35 is shallower than the body region 40.

The second contact electrode 52 is provided in the third trench 35. The second contact electrode 52 is in contact with the body region 40 on the side surface of the third trench 35. The second contact electrode 52 is in contact with the source region 42 on the side surface of the third trench 35. The second contact electrode 52 is electrically connected to the source electrode 12. The second contact electrode 52 is in contact with, for example, the source electrode 12.

The second contact electrode 52 has a function of electrically connecting the source electrode 12 and the body region 40.

The second contact electrode 52 is made of a metal. The second contact electrode 52 is made of, for example, tungsten, titanium, titanium nitride, or aluminum.

By providing the second contact electrodes 52, it is unnecessary to connect the source electrode 12 and the body region 40 on the first plane P1. Therefore, it is possible to reduce, for example, the distance between the first trench 32 and the second trench 34. By reducing the distance between the first trench 32 and the second trench 34, for example, it is possible to further reduce the on-resistance.

In addition, the second contact electrode 52 can be formed simultaneously with the source electrode 12. In this case, for example, the second contact electrode 52 and the source electrode 12 are made of consecutive identical materials.

As described above, according to the seventh embodiment, it is possible to realize a MOSFET capable of reducing on-resistance.

Eighth Embodiment

A semiconductor device according to an eighth embodiment is different from the semiconductor device according to the first embodiment from the point of view that, in the semiconductor device according to the eighth embodiment, the shape of the region surrounded by the first trench on the first plane is a hexagon. Hereinafter, in some cases, a portion of contents overlapping with the semiconductor device according to the first embodiment may be omitted in description.

The semiconductor device according to the eighth embodiment is a vertical type transistor where a gate electrode is buried in a trench. The semiconductor device according to the eighth embodiment is a vertical type power MOSFET. The semiconductor device according to the eighth embodiment is a MOSFET 800.

Figure 14:
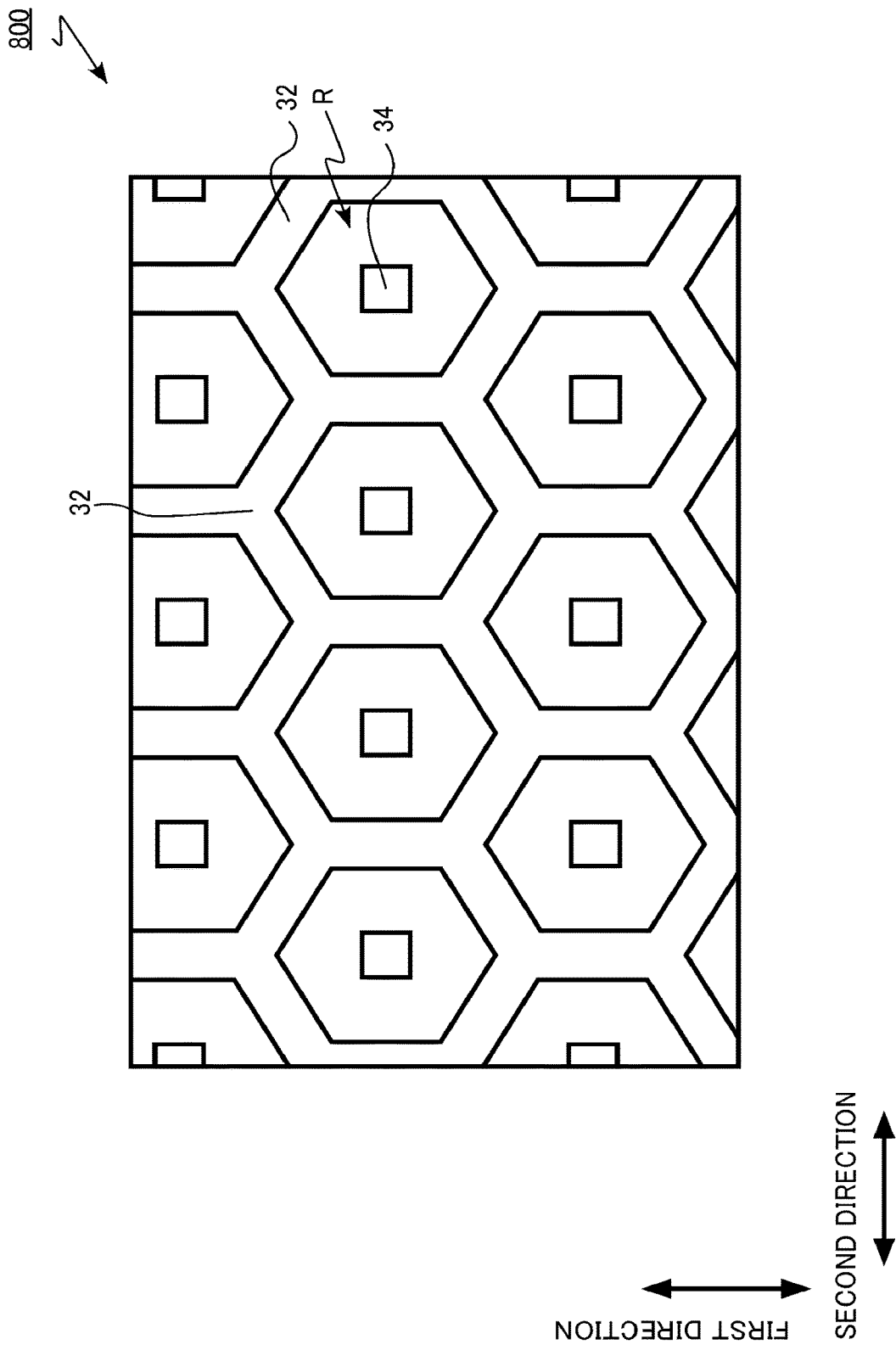
FIG. 14 is a schematic plan view of a semiconductor device according to an eighth embodiment.

FIG. 14 is a schematic plan view of the semiconductor device according to the eighth embodiment. FIG. 14 is a view according to FIG. 3 of the first embodiment.

In the first plane P1, the shape of the region (R in FIG. 14) surrounded by the first trench 32 is a hexagon.

As described above, according to the eighth embodiment, it is possible to realize a MOSFET capable of reducing on-resistance.

As described above, in the first to eighth embodiments, a case where the first conductivity type is an n-type and the second conductivity type is a p-type has been described as an example, but the configuration where the first conductivity type is a p-type and the second conductivity type is an n-type can be employed.

In addition, in the first to eighth embodiments, a case where the semiconductor material is silicon has been described as an example, but silicon carbide (SiC), gallium nitride (GaN), or other semiconductor materials can be used.

In addition, in the first to eighth embodiments, a case where the shape of the region surrounded by the first trench on the first plane is a square or a hexagon has been described as an example, but the shape of the region surrounded by the first trench on the first plane may be a circle, an ellipse, a triangle, or other shapes.

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
 a semiconductor layer having a first plane and a second plane facing the first plane, the semiconductor layer including
 a first trench located on a side closer to the first plane and having a mesh-shaped pattern on the first plane,
 a second trench located on the side closer to the first plane and surrounded by the first trench,
 a first semiconductor region of a first conductivity type,
 a second semiconductor region of a second conductivity type located between the first semiconductor region and the first plane, and
 a third semiconductor region of the first conductivity type located between the second semiconductor region and the first plane;
 a gate electrode located in the first trench;
 a first field plate electrode located between the gate electrode and the second plane in the first trench;
 a second field plate electrode located in the second trench;

a gate insulating layer located between the gate electrode and the semiconductor layer;

a first insulating layer located between the first field plate electrode and the semiconductor layer;

a second insulating layer located between the second field plate electrode and the semiconductor layer;

a first electrode located on the side closer to the first plane and electrically connected to the third semiconductor region, the first field plate electrode, and the second field plate electrode; and a second electrode located on aside of the semiconductor layer closer to the second plane.

2. The semiconductor device according to claim 1, wherein the second field plate electrode is in contact with the first electrode.

3. The semiconductor device according to claim 1, further comprising a first metal region provided in the second trench, being in contact with the second semiconductor region on a side surface of the second trench, and electrically connected to the first electrode.

4. The semiconductor device according to claim 3, wherein the first metal region is in contact with the third semiconductor region on the side surface of the second trench.

5. The semiconductor device according to claim 1, wherein a thickness of the second insulating layer is larger than a thickness of the first insulating layer.

6. The semiconductor device according to claim 1, wherein a first distance from the second plane to the first trench is larger than a second distance from the second plane to the second trench.

7. The semiconductor device according to claim 1, wherein at least a portion of the first trench extends in the first direction on the first plane, and the first width of the at least a portion in a second direction perpendicular to the first direction is smaller than a second width of the second trench in the second direction.

8. The semiconductor device according to claim 1, wherein the second field plate electrode is made of a metal.

9. The semiconductor device according to claim 1, wherein the semiconductor layer has a third trench located on the side closer to the first plane and located between the first trench and the second trench, and wherein the semiconductor device further comprises a second metal region provided in the third trench, being in contact with the second semiconductor region on a side surface of the third trench, and electrically connected to the first electrode.

10. The semiconductor device according to claim 9, wherein the second metal region is in contact with the third semiconductor region on a side surface of the third trench.

11. The semiconductor device according to claim 1, wherein a thickness of the first insulating layer is larger than a thickness of the gate insulating layer.

12. The semiconductor device according to claim 1, wherein a thickness of the second insulating layer is larger than a thickness of the gate insulating layer.

13. The semiconductor device according to claim 1, wherein the semiconductor layer is made of silicon.

14. The semiconductor device according to claim 1, wherein a shape of a region surrounded by the first trench on the first plane is a square or a hexagon.

15. The semiconductor device according to claim 1, wherein the first conductivity type is an n-type.

* * * * *